(12) United States Patent
Isoda (10) Patent No.: US 7,190,003 B2
(45) Date of Patent: Mar. 13, 2007

(54) SURFACE-MOUNT TYPE LIGHT EMITTING DIODE AND METHOD FOR MANUFACTURING IT

(75) Inventor: Hiroto Isoda, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 11/049,933

(22) Filed: Feb. 4, 2005

(65) Prior Publication Data

US 2005/0173721 A1    Aug. 11, 2005

(30) Foreign Application Priority Data

Feb. 5, 2004   (JP)   ............... 2004-028978

(51) Int. Cl.
*H01L 33/00* (2006.01)
(52) U.S. Cl. .................. 257/98; 257/100; 257/99; 362/296; 362/362; 362/363
(58) Field of Classification Search ............... 257/98, 257/100, 99; 362/296, 362, 363, 364, 365
See application file for complete search history.

(56) References Cited

U.S. PATENT DOCUMENTS 6,593,598 B2 * 7/2003 Ishinaga ................. 257/98
6,897,490 B2 * 5/2005 Brunner et al. ............ 257/98

OTHER PUBLICATIONS

Matsumoto, Seiichi, Electronic Display. Ohmsha. Jul. 7, 1995. Japan. p. 190.

* cited by examiner

*Primary Examiner*—Minhloan Tran
*Assistant Examiner*—Tan Tran
(74) *Attorney, Agent, or Firm*—Browdy and Neimark, PLLC (57) ABSTRACT

A surface-mount type light emitting diode, comprising, a substrate, cathode and anode electrode patterns provided on the substrate, a light emitting diode element provided on the substrate to electrically connect with the cathode and anode electrode patterns, a light permeable member disposed to encapsulate the light emitting diode element, and a total-reflection-surface-formed part provided peripherally of the light emitting diode element within the light permeable member and including a groove and gas or filling member filled in the groove to reflect the emitted light from the light emitting diode element efficiently and upwardly.

10 Claims, 11 Drawing Sheets

SURFACE-MOUNT TYPE LIGHT EMITTING DIODE AND METHOD FOR MANUFACTURING IT

CROSS-REFERENCE TO THE RELATED APPLICATION

The application claims the priority benefit of Japanese Patent Application No. 2004-28978, filed on Feb. 5, 2004, the entire descriptions of which are incorporated herein by reference.

BACKGROUND OF THE INVENTION

1. Field of the Invention

The present invention relates to an improvement in a surface-mount type light emitting diode, which has a substrate, a light emitting diode element provided on the substrate and a light permeable member for encapsulating the light emitting diode element, and is directly mounted on a surface of a mother board or the like, for example, and a method for manufacturing the surface-mount type light emitting diode.

2. Description of Related Art

Figure 16:
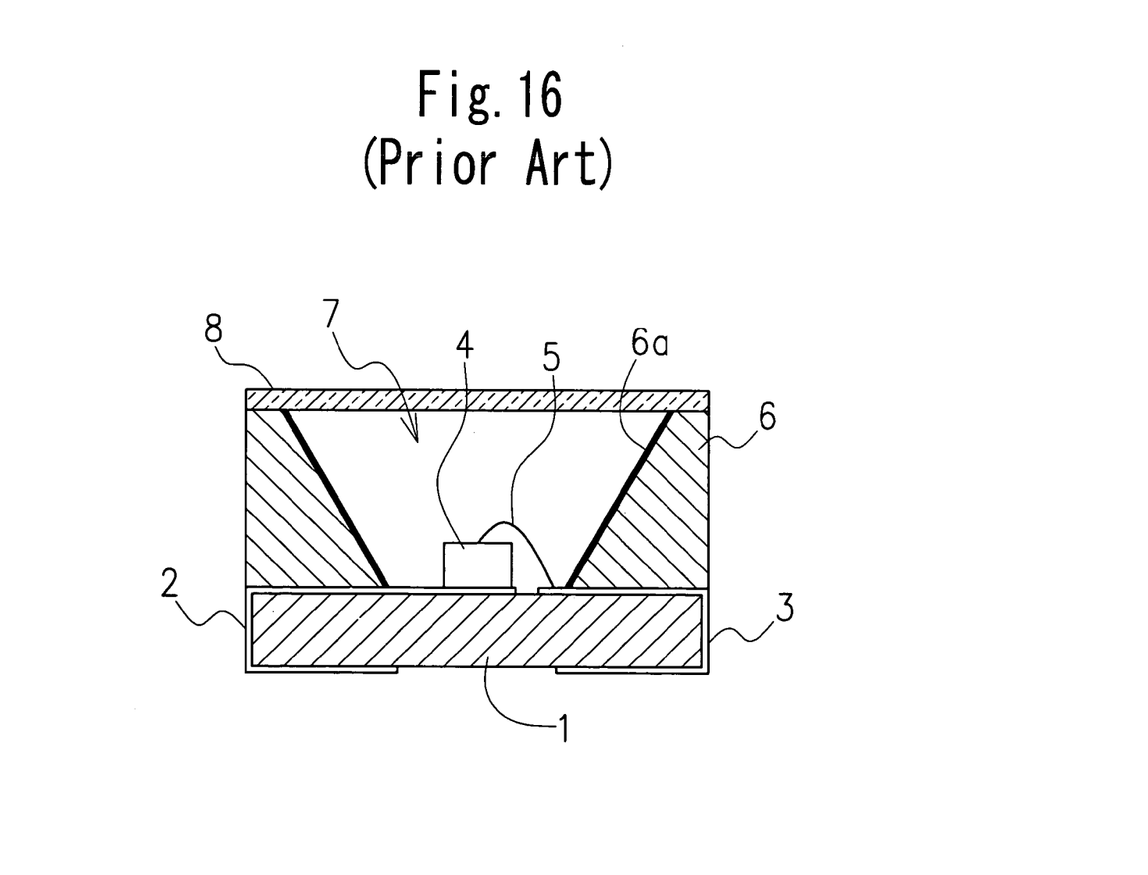
FIG. 16 is a schematic structural view of a conventional surface-mount type light emitting diode.

FIG. 16 illustrates a schematic structure of a conventional surface-mount type light emitting diode referred to as a metal-film reflecting cup type. The surface-mount type light emitting diode of this kind is described on page 190 in "Electronic Display" written by Shoichi Matsumoto and published by Ohom Co., Ltd on Jul. 7, 1995, for example. The surface-mount type light emitting diode includes a substrate, cathode and anode electrode patterns 2 and 3 provided on the substrate 1, and a light emitting diode element 4 provided on the cathode electrode pattern 2 so as to electrically connect with it. The light emitting diode element 4 and the anode electrode pattern 3 are electrically connected through a bonding wire 5.

Moreover, a supporting member 6, for example, made of epoxy resin is provided on the substrate 1 at an outer peripheral portion thereof. The supporting member 6 has, at an inside thereof, an inclined reflecting surface 6a comprising a metal film, and, at an upper portion thereof, an opening 7. The opening 7 is encapsulated by a glass plate 8, for example.

In that kind of a surface-mount type light emitting diode, light emitted from side surfaces of the light emitting diode element 4 is reflected upwardly on the reflecting surface 6a and directed through the glass plate 8 to exterior.

However, in the above-mentioned surface-mount type light emitting diode, although a luminescence of light is increased by reflecting the emitted light from the side surfaces of the light emitting diode element 4 upwardly on the reflecting surface 6a, an optical reflectance on the reflecting surface 6a declines to a range of about 80 to 90 percent (%). Therefore, there is a loss in the reflection of light. Moreover, the reflecting surface 6a influenced by an environment may cause corrosion, if it is used over a long term, hence the reflective index of light tends to reduce. Therefore, there is a problem in reliability of the reflecting surface when it is used over a long term.

SUMMARY OF THE INVENTION

An object of the present invention is to provide a surface-mount type light emitting diode capable of reflecting the emitted light from a light emitting diode element efficiently and upwardly, and a method for manufacturing the surface-mount type light emitting diode.

To accomplish the above object, a surface-mount type light emitting diode in an aspect of the present invention comprises a substrate, cathode and anode electrode patterns provided on the substrate, a light emitting diode element provided on the substrate to electrically connect with the cathode and anode electrode patterns, a light permeable member disposed on the substrate to encapsulate the light emitting diode element, and a part forming a total-reflection surface provided peripherally of the light emitting diode element within the light permeable member and configured to totally reflect the light emitted from the light emitting diode element and direct the reflected light upwardly.

A surface-mount type light emitting diode in another aspect of the present invention comprises a substrate, cathode and anode electrode patterns provided on the substrate, a light emitting diode element provided on the substrate to electrically connect with the cathode and anode electrode patterns, a light permeable member disposed on the substrate to seal the light emitting diode element, a groove annularly formed centering around the light emitting diode element and having an inclined surface extending in a height direction from a surface of the substrate within the light permeable member, gas or a filling member contained in the groove, and a boundary surface provided between the light permeable member and the gas or filling member in the inclined surface. The boundary surface forms a total-reflection surface for reflecting the emitted light from at least side surfaces of the light emitting diode element upwardly and totally by a difference between a refractive index of the gas or filling member and a refractive index of the light permeable member.

A method for manufacturing a surface-mount type light emitting diode in still another aspect of the present invention comprises a process for forming a light permeable member including a concave portion, and an annular groove disposed to surround the concave portion and having an inclined surface disposed to face the concave portion, a process for filling the concave portion with a light permeable resin, a process for mounting a light emitting diode element on the substrate, a process for mounting the substrate on the light permeable member such that the light emitting diode element is dipped in the light permeable resin in the concave portion in a state in which the light permeable resin in the concave portion is unhardened, and a process for filling the annular groove with gas or a filling member.

DETAILED DESCRIPTION OF THE PREFERRED EMBODIMENTS

Preferred embodiments of a surface-mount type light emitting diode according to the present invention will be explained with reference to the accompanying drawings below.

Figure 1:
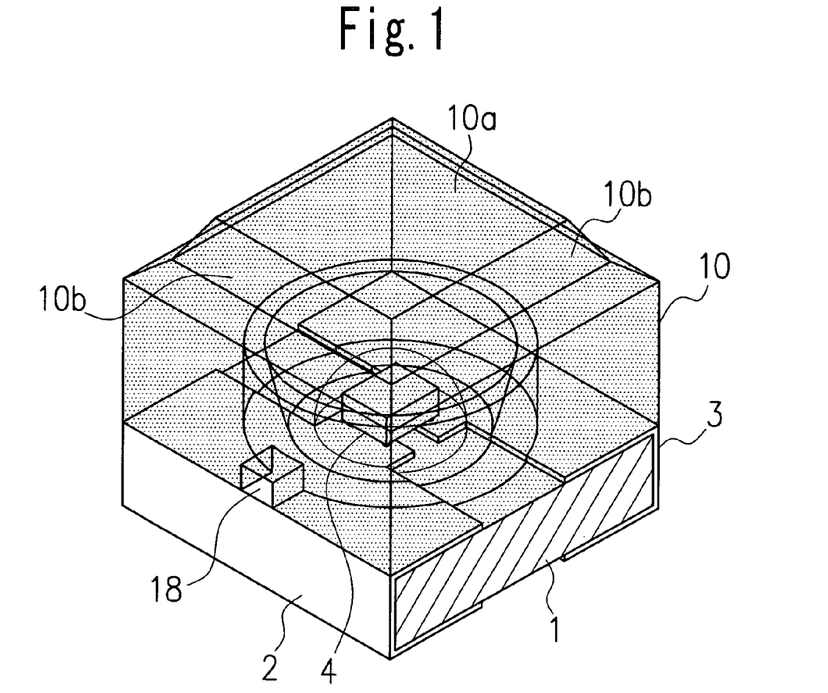
FIG. 1 is a perspective view showing a surface-mount type light emitting diode according to a first embodiment of the present invention.
Figure 2:
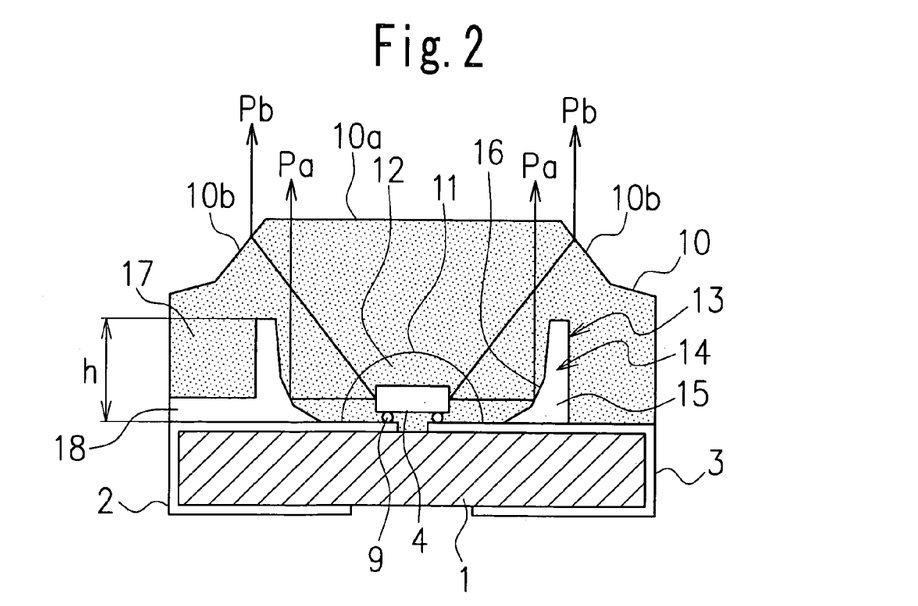
FIG. 2 is a sectional view of the surface-mount type light emitting diode shown in FIG. 1.
Figure 3:
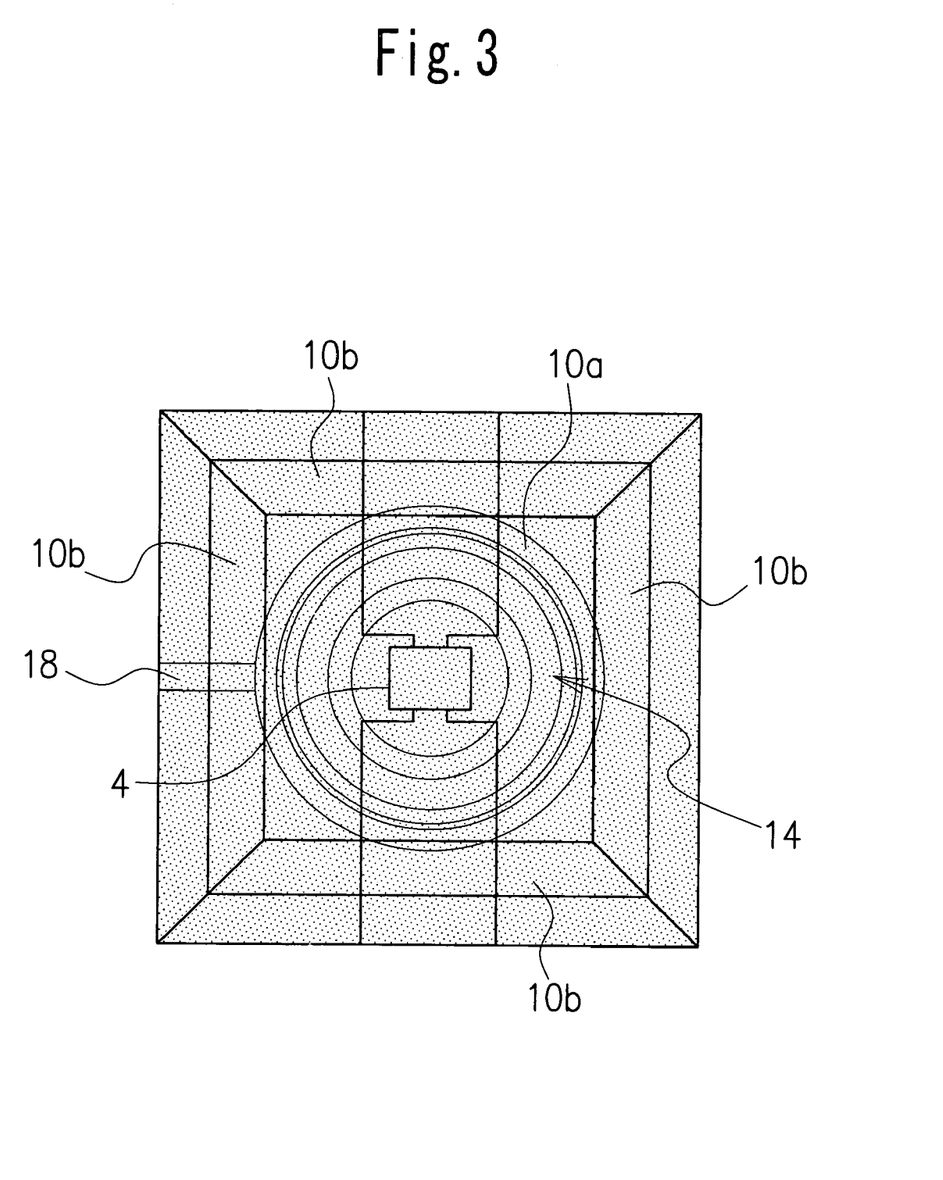
FIG. 3 is a plan view of the surface-mount type light emitting diode shown in FIG. 1.

FIGS. 1 to 3 illustrate a structure from different perspectives, showing an embodiment of the surface-mount type light emitting diode. The surface-mount type light emitting diode comprises a substrate 1. A cathode electrode pattern 2 and an anode electrode pattern 3 are provided on the substrate 1. The cathode and anode electrode patterns 2 and 3 have convex-shaped portions disposed face-to-face with each other (see FIG. 1). A light emitting diode element 4 is disposed on the cathode and anode electrode patterns 2 and 3 at the convex-shaped portions so as to bridge them, and electrically connected between the cathode and anode electrode patterns 2 and 3 by one or more bumps 9. Here, shapes of the cathode and anode electrode patterns 2 and 3 are not limited to ones shown in drawings, because it is sufficient only to electrically connect them with the light emitting diode element 4 on the substrate 1.

The light emitting diode element 4 mounted on the substrate 1 is encapsulated by a light permeable member 10 made of a resin such as epoxy resin, for example. The light permeable member 10 is fixed on the substrate 1 by an adhesive. A semi-spherical concave portion 11 is provided in a portion of the light permeable member 10 facing to the light emitting diode element 4, and a light permeable resin 12 of epoxy resin or the like, which is the same material as that of the light permeable member 10 is filled in the semi-spherical concave portion 11.

On a periphery of the light emitting diode element 4 within the light permeable member 10 is provided an annular total-reflection-surface-formed part 13 to totally reflect and direct upwardly light from the light emitting diode element 4. Specifically, the total-reflection-surface-formed part 13 comprises a groove 14 provided annularly on a center of the light emitting diode element 4 and air 15 filled in the groove 14. The groove 14 has an inclined surface 16 inclining at an angle to a surface of the substrate 1 and extending in a height direction from the substrate.

The total-reflection-surface-formed part 13 is configured to form a total-reflection surface to totally reflect the emitted light from the light emitting diode element 4 on a boundary surface of the light permeable member 10 and the air 15, in other words, the inclined surface 16 by a difference between a refractive index $n_0$ (=1) of the air 15 filled in the groove 14 and a refractive index $n_1$ (=1.55) of the light permeable member or epoxy resin 10.

A condition for accomplishing the total reflection of the emitted light from the light emitting diode element 4 in the inclined surface 16 is as follows.

Figure 4:
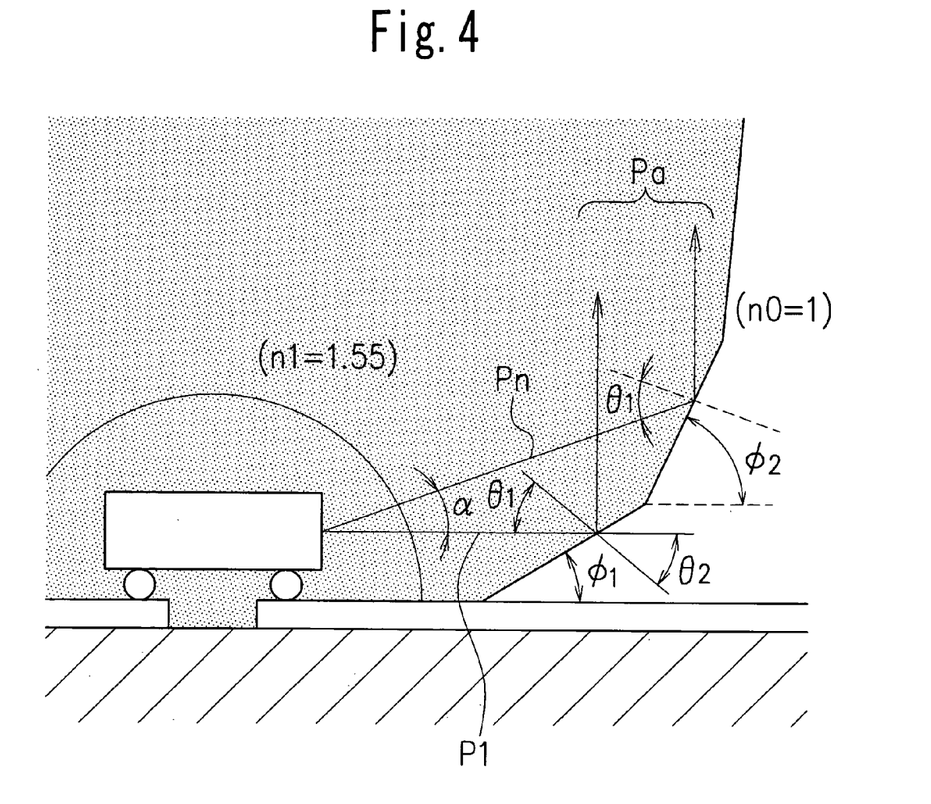
FIG. 4 is a view for explaining a condition of totally reflecting light emitted from a light emitting diode element in the surface-mount type light emitting diode.

If there is a relationship of $$0° \leq \theta_1 \geq \sin^{-1}(n_0/n_1) \quad (1)$$

between an incident angle $\theta_1$ and an exit angle $\theta_2$ when the emitted light from the light emitting diode element 4 enters in the boundary surface, in other words, the inclined surface 16 between the light permeable member 10 and the air 15, the emitted light from side surfaces of the light emitting diode element 4 are totally reflected on the inclined surface 16. The incident angle $\theta_1$ of the emitted light from the light emitting diode element 4 may be $\theta_1 > 40.18°$ in order to allow the emitted light from the side surfaces of the light emitting diode element 4 to be totally reflected on the inclined surface 16, if the refractive index $n_0$ of the air 15 has 1 and the refractive index $n_1$ of the light permeable member 10 has 1.55, for example, as shown in FIG. 4. Moreover, if the refractive index $n_1$ of the light permeable member 10 has 1.70 by use of a resin other than the epoxy resin, the incident angle $\theta_1$ of the emitted light from the light emitting diode element 4 may be $\theta_1 > 36.03°$, and if the refractive index $n_1$ of the light permeable member 10 has 1.40, the incident angle $\theta_1$ of the emitted light from the light emitting diode element 4 may be $\theta_1 > 45.68°$.

Accordingly, when the refractive index $n_1$ of the light permeable member 10 is 1.55, for example, if parts of inclined angles $\phi_1$ and $\phi_2$ are formed on the inclined surface 16 so that the light $P_1$ emitted from the side surfaces of the light emitting diode element 4 and all light $P_n$ emitted obliquely upward, other than the light $P_1$ at an angle $\alpha$ enter at the incident angle $\theta_1$ (>40.18°), the light $P_1$ and the light $P_n$ emit from the light emitting diode element 4 are totally reflected on the inclined surface 16 and directed upwardly.

Meanwhile, for a condition in which the emitted light from the side surfaces of the light emitting diode element 4 is totally reflected on the inclined surface 16, straight-line groups may be formed on the inclined surface 16 such that the inclined angles $\phi_1$ and $\phi_2$ (=inclined angle $\phi$) shown in FIG. 4 satisfy the following formula (2) or the inclined surface 16 may be formed such that the inclined angle $\phi$ satisfies the formula (2).

$$\phi < \alpha + 90° - \sin^{-1}(n_0/n_1) \quad (2)$$

Moreover, if there is a relationship of $$\alpha > \sin^{-1}(n_0/n_1) \quad (3)$$

the inclined angle $\phi$ (=$\phi_1$, $\phi_2$) of the inclined surface 16 may be orthogonal (=90°).

Figure 5:
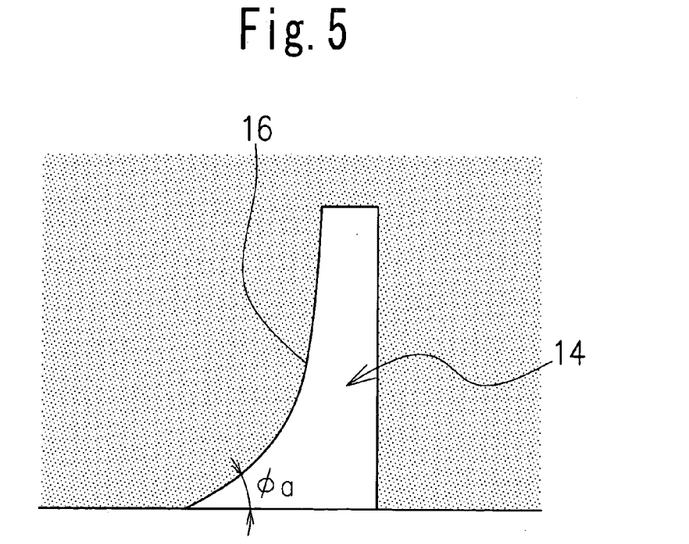
FIG. 5 is a structural view of an inclined surface in the surface-mount type light emitting diode.
Figure 6:
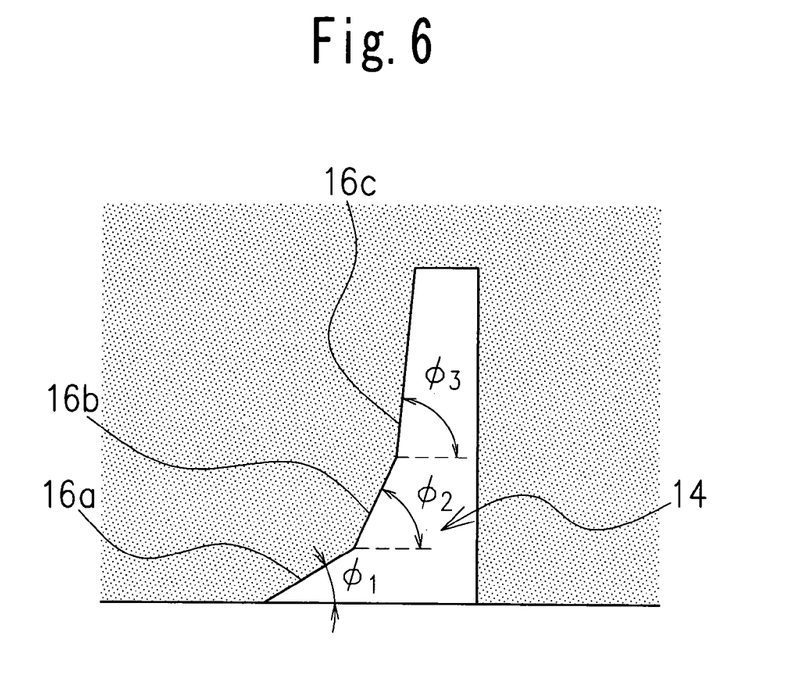
FIG. 6 is a structural view showing an inclined surface in another embodiment in the surface-mount type light emitting diode.

The inclined surface 16 may be formed in a curved surface in which an inclined angle $\phi_a$ varies continuously in a height direction from the surface of the substrate 1, as shown in FIG. 5, or in a plurality of inclined surfaces 16a, 16b and 16c ..., in which the inclined angles $\phi_1$, $\phi_2$ and $\phi_3$ are different with respect to each other, as shown in FIG. 6.

The inclined surface 16 is also capable of reflecting totally the lights $P_1$ and $P_n$ emitted from the light emitting diode element 4, and directivity for the emitted light Pa can be sharpened, if an inclined surface having an increased height h is used, in other words, if a groove 14 having an increased depth is formed.

A plan part 10a, and inclined parts 10b are provided on an upper surface of the light permeable member 10. The plan part 10a is formed on a right above portion of the light emitting diode element 4. In addition, the inclined parts 10b comprise four surfaces formed peripherally of the plan part 10a and refract light Pb emitted obliquely upward from the light emitting diode element 4 so that the refracted light has a parallel angle with the light Pb emitted from the plan part 10a.

A supporting part 17 is formed on an outer side of the groove 14 in the light permeable member 10. A contacting area of the light permeable member 10 and the substrate 1 are widened, hence the light permeable member 10 can be securely fixed on the substrate 1, by providing the supporting part 17. Moreover, a gas or air release hole 18 is provided in the supporting part 17 of the light permeable member 10 so as to communicate the groove 14 with the exterior. The air release hole 18 operates to prevent the light permeable member 10 from rupturing due to expansion of the air 15 in the groove 14, when a reflow soldering is applied to connect the mounted light emitting diode element 4 on the substrate 1.

Next, a method for manufacturing the surface-mount type light emitting diode as described above will be explained.

Figure 7:
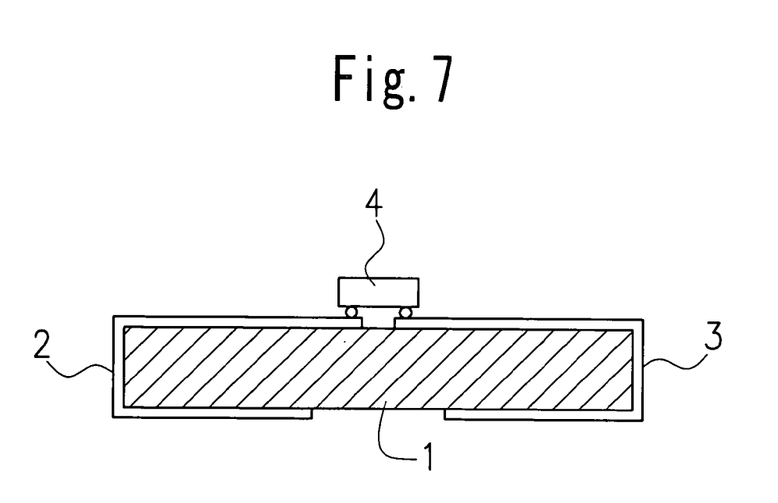
FIG. 7 is a view showing a mounting process of a light emitting diode element on a substrate in a method for manufacturing a surface-mount type light emitting diode.

As shown in FIG. 7, the light emitting diode element 4 is directly mounted through bumps 9 on the cathode and anode electrode patterns 2 and 3 on the substrate 1.

Figure 8:
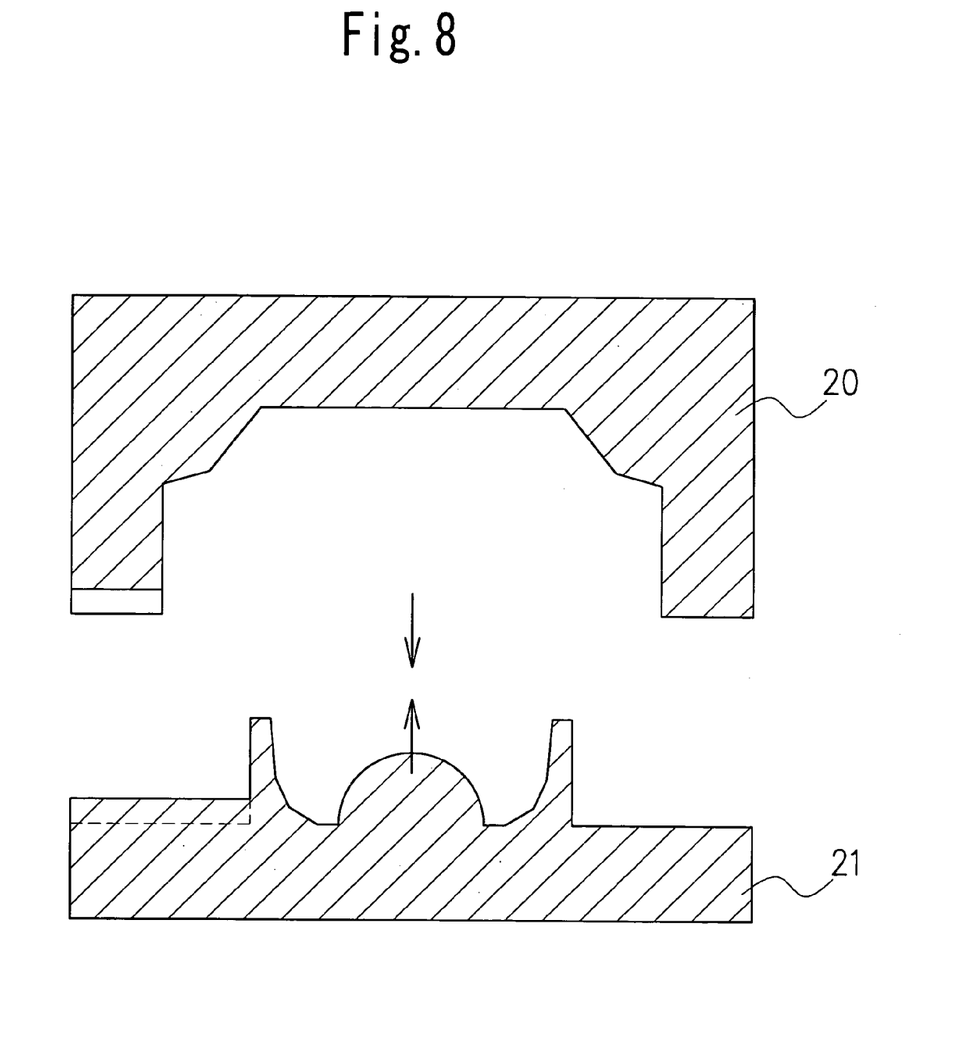
FIG. 8 is a view showing a forming process of a light permeable member in the manufacturing method.

On the other hand, a first die 20 and a second die 21 are prepared as shown in FIG. 8. One of the first and second dies 20 and 21 is an upper die and the other is a lower die. Molding parts for forming the plan part 10a and the inclined parts 10b in the light permeable member 10 are provided in the first die 20. Molding parts for forming the concave portion 11 and the groove 14 having the inclined surface 16 are provided in the second die 21.

A light permeable resin such as liquid epoxy resin or the like, for example, is poured into a space between the first and second dies 20 and 21 in a state in which the first and second dies 20 and 21 are assembled. When the first and second dies 20 and 21 are disassembled after the light permeable resin is hardened, the light permeable member 10 including the groove 14 having the inclined surface 16 and the concave 11 is formed.

Figure 9:
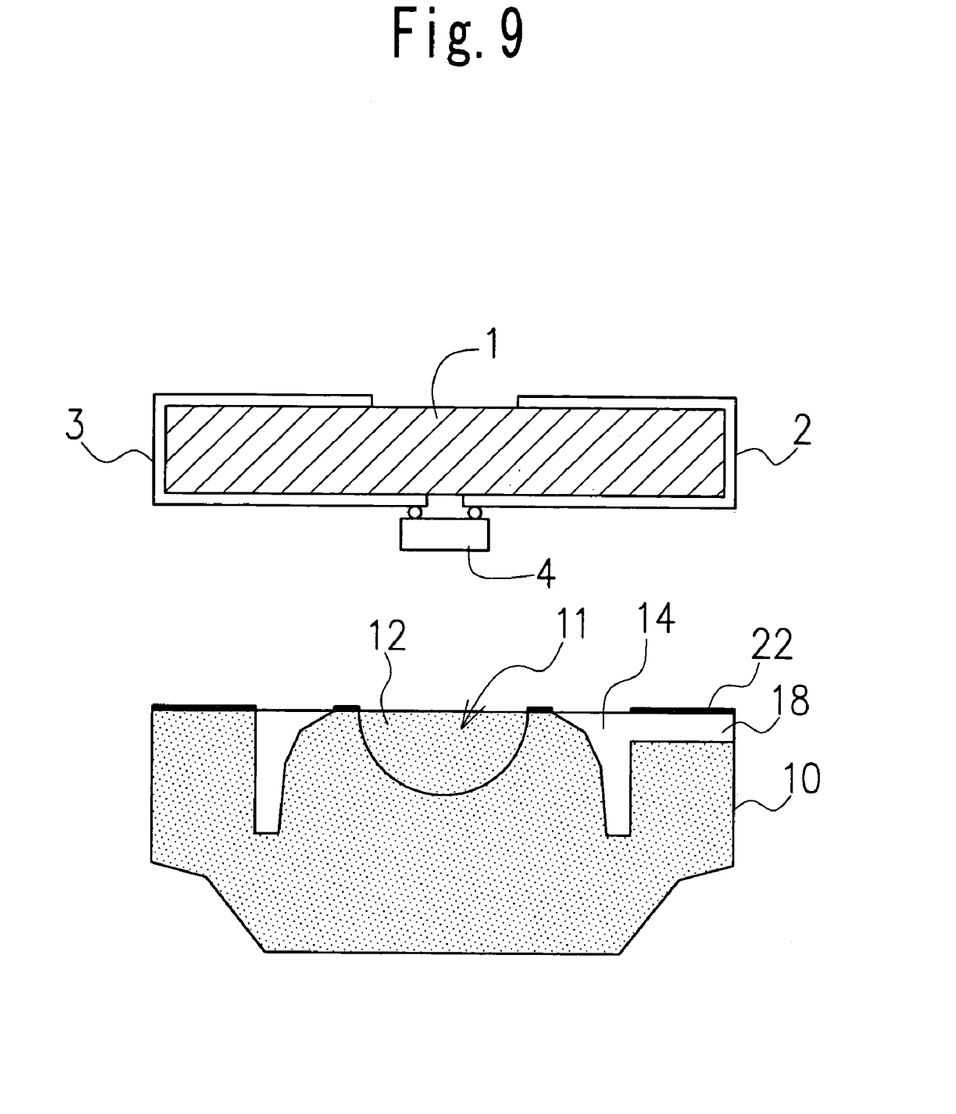
FIG. 9 is a view showing a fixing process of the substrate on the light permeable member in the manufacturing method.

Next, as shown in FIG. 9, the substrate 1 is disposed so that the light emitting diode element 4 is directed downwardly, and the light permeable member 10 is disposed so that the concave portion 11 is directed upwardly.

Next, a light permeable resin 12 such as liquid epoxy resin, for example, is filled into the concave portion 11 of the light permeable member 10.

Next, the substrate 1 is fixed through an adhesive 22 on the light permeable member 10. At this time, the light emitting diode element 4 is positioned at a central portion of the concave portion 11 and dipped in the light permeable resin 12. Next, the air 15 is filled into the groove 14.

Next, when the light permeable resin 12 is hardened, the surface-mount type light emitting diode is manufactured, as shown in FIG. 1.

Figure 10:
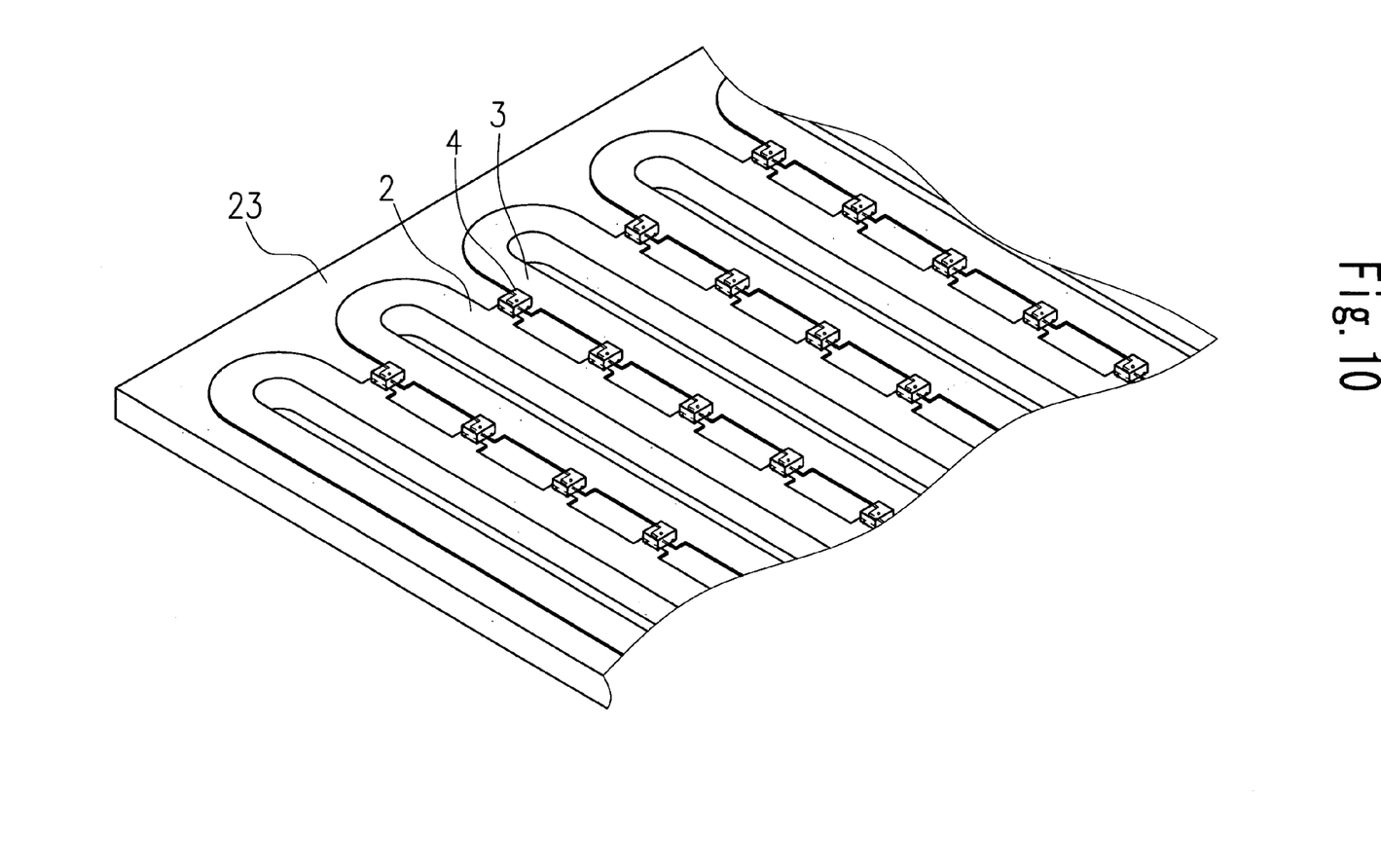
FIG. 10 is a perspective view of a large-scaled substrate in which a plurality of cathode and anode electrode patterns are regularly formed.

In addition, although the above-mentioned method for manufacturing the surface-mount type light emitting diode has been described so as to manufacture one surface-mount type light emitting diode, actually, the manufacturing method is used to make a large-scaled collecting substrate 23 in which a plurality of cathode and anode electrode patterns 2 and 3 are regularly arranged, and a plurality of light emitting diode elements 4 are respectively mounted on the adjacent cathode and anode electrode patterns 2 and 3 on the large-scaled collecting substrate 23 in longitudinal and lateral directions, as shown in FIG. 10.

Figure 11:
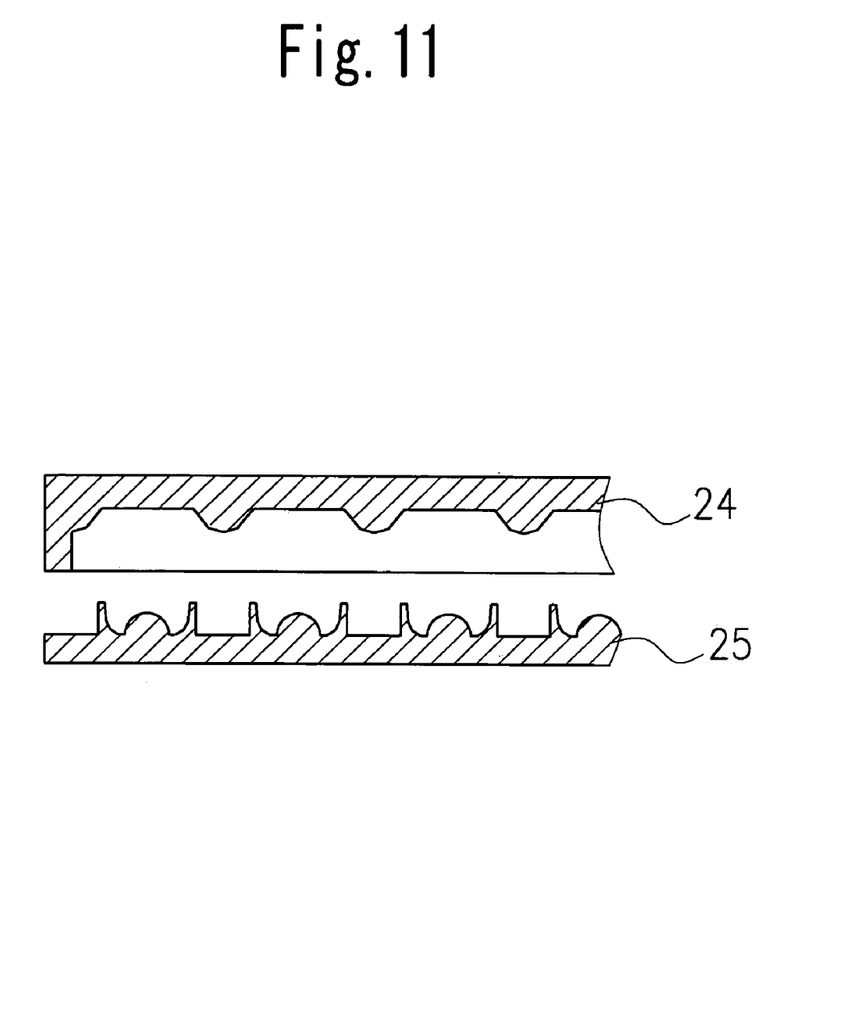
FIG. 11 is a view showing first and second dies on which a plurality of dies for light permeable members are formed.

On the other hand, a first die 24 and a second die 25 are prepared as shown in FIG. 11. Molding parts for forming a plan part 10a and inclined parts 10b in each of a plurality of light permeable members 10 are provided in the first die 24. Molding parts for forming each concave portion 11 and each groove 14 having an inclined surface 16, in the plurality of light permeable members 10 are provided in the second die 25.

A light permeable resin such as liquid epoxy resin or the like, for example, is poured into a space between the first and second dies 24 and 25 in a state in which the first and second dies 24 and 25 are assembled.

Figure 12:
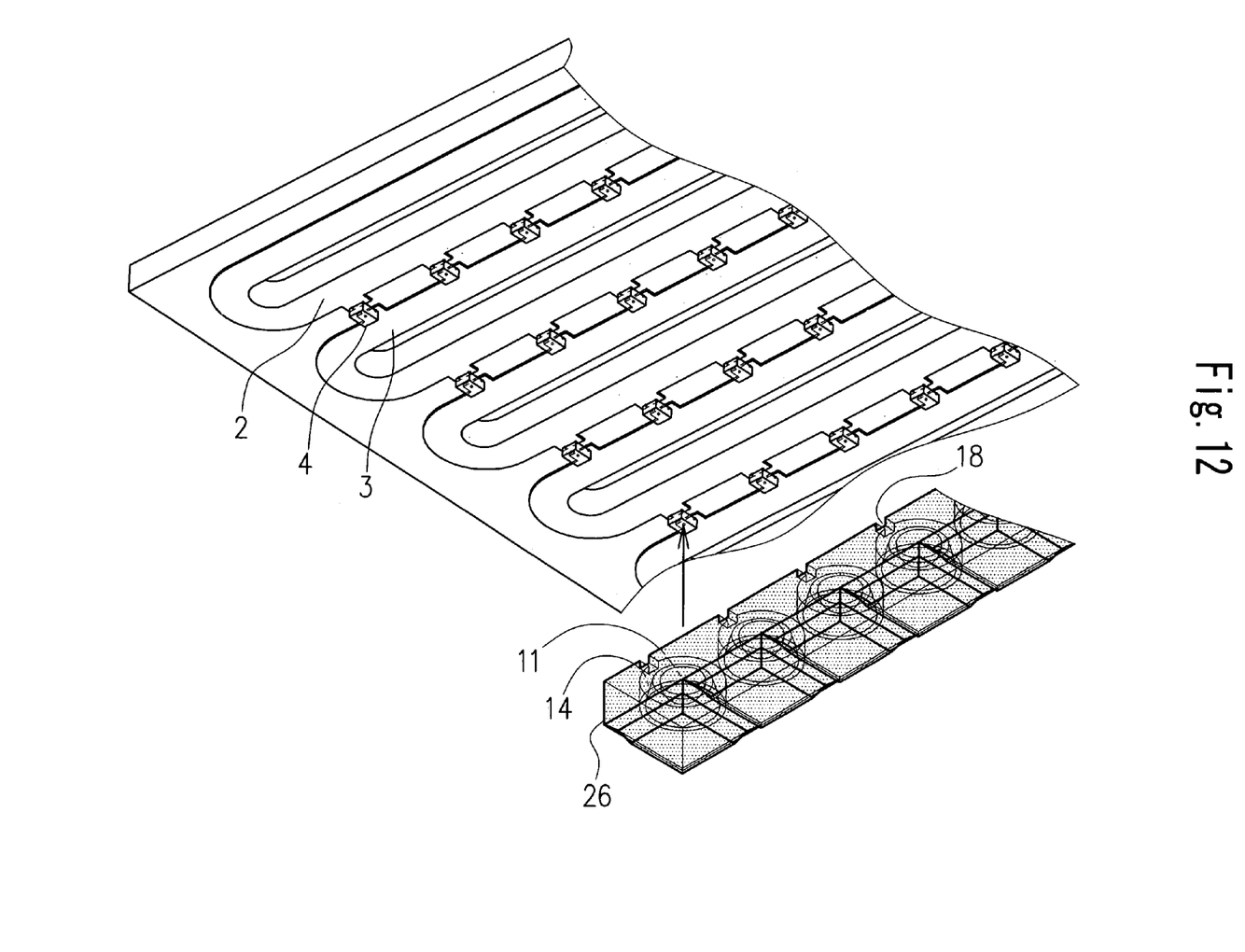
FIG. 12 is a view showing a disposition of a large-scaled collecting substrate and a large-scaled light permeable member.

When the first and second dies 24 and 25 are disassembled after the light permeable resin is hardened, there are formed large-scaled light permeable members 26, which are shown in FIG. 12 and have the grooves 14 including the inclined surfaces 16, and the concave portions 11 are formed integrally.

Next, as shown in FIG. 12, the large-scaled collecting substrate 23 is disposed so that the light emitting diode elements 4 are directed downwardly, and the large-scaled light permeable members 26 are disposed so that the concave portions 11 and the grooves 14 are directed upwardly.

Next, a light permeable resin 12 such as liquid epoxy resin, for example, is filled into each of the concave portions 11 of the light permeable members 26.

Next, the large-scaled substrate 23 is fixed on the light permeable member 26 by an adhesive 22. At this time, each light emitting diode element 4 is positioned at a central portion of each concave portion 11 and dipped in the light permeable resin 12.

Next, when the light permeable resin 12 is hardened, a plurality of surface-mount type light emitting diodes are manufactured.

Next, the large-scaled light permeable members 26 and the large-scaled substrates 23 are cut every one surface-mount type light emitting diode.

In this way, according to the first embodiment as described above, because there is provided the total-reflection-surface-formed part 13 disposed peripherally of the light emitting diode element 4 within the light permeable member 10 and including the groove 14 in which air is filled and the inclined surface 16 for totally reflecting the emitted light from the light emitting diode element 4, the light $P_1$ emitted from the side surfaces of the light emitting diode element 4 and all the light $P_n$ emitted at the angle α relative to the light $P_1$ are totally reflected on the inclined surface 16 and can be upwardly emitted. Thereby, because the emitted light from the light emitting diode element 4 is totally reflected on the inclined surface 16, and for example, can be directed so as to collect it at the plan part 10a corresponding to the upper surface of the light permeable member 10, the luminance of the surface-mount type light emitting diode can be increased.

Moreover, because the inclined surface 16 forms the total-reflection surface for light by the refractive indexes $n_1$ and $n_0$ of the light permeable member 10 and the air, there is no loss in reflection of light on the total-reflection surface. In addition, the inclined surface 16 making the total-reflection surface uses a surface of the light permeable member 10 as is, therefore it does not corrode depending on used circumstances, the reliability when it is used over a long term can be increased.

Furthermore, because the inclined surface 16 making the total-reflection surface is formed by pouring the light permeable resin between the first and second dies 20 and 21, even if it is formed in, for example, the curved surface as shown in FIG. 5 or the plurality of inclined surfaces 16a, 16b and 16c as shown in FIG. 6, the inclined surface 16 can be formed in a high accurate surface. Accordingly, the emitted light from the light emitting diode element 4 can be emitted and reflected with a high efficiency without losing.

Moreover, because only the air is filled in the groove 14, the surface-mount type light emitting diode can be inexpensively manufactured without using an especial member in order to allow the light to be totally reflected.

Moreover, because the light permeable member 10 includes the inclined parts 10b, the light Pb emitted obliquely upward from the light emitting diode element 4 is refracted and can be set to become parallel with the light Pa emitted from the plan part 10a, thereby the luminescence of the surface-mount type light emitting diode can be increased.

In addition, because the supporting part 17 is provided outside the light permeable member 10, the light permeable member 10 can be fixed securely and stably on the substrate 1.

Figure 13:
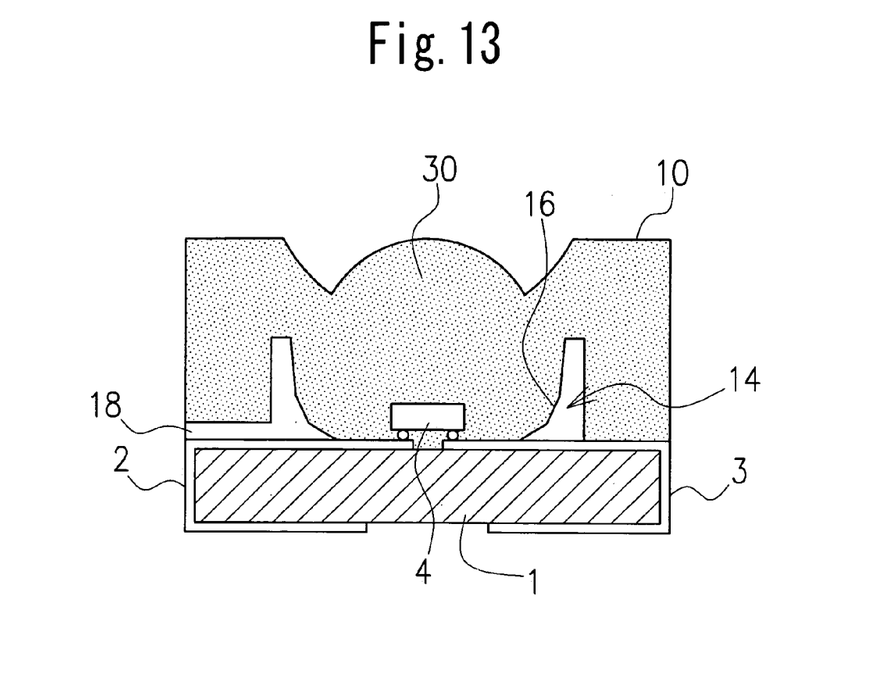
FIG. 13 is a sectional view of a surface-mount type light emitting diode according to a second embodiment of the present invention.
Figure 14:
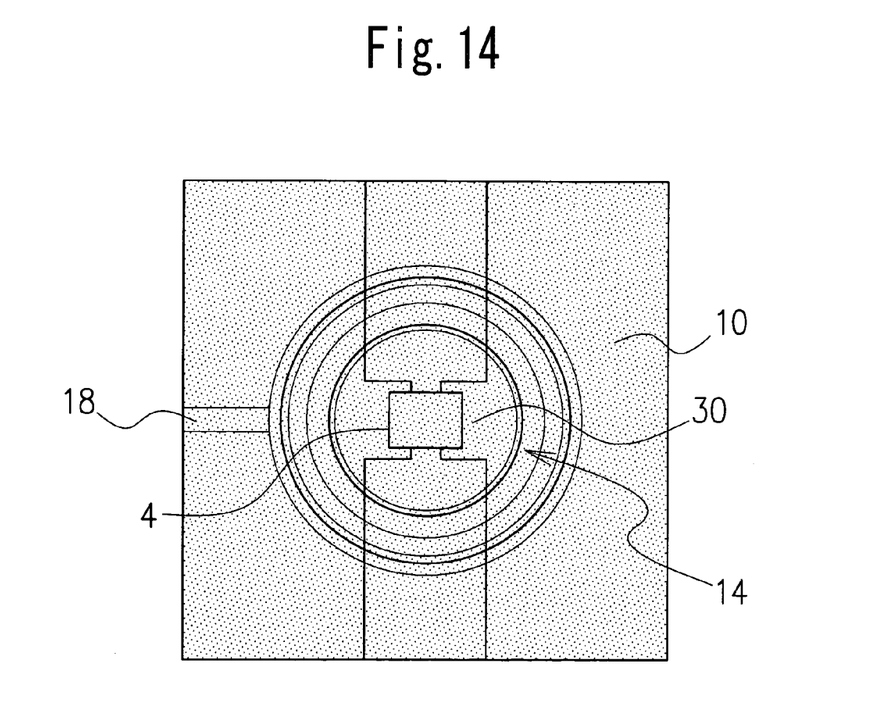
FIG. 14 is a plan view of the surface-mount type light emitting diode shown in FIG. 13.

Next, a second embodiment of the present invention will be explained with reference to FIGS. 13 and 14. In the second embodiment, the same reference numerals are attached to the similar parts as in FIGS. 2 and 3.

A surface-mount type light emitting diode shown in the second embodiment includes a lens 30 provided on a portion of the light permeable member 10 above the light emitting diode element 4. The lens 30 collects and emits upwardly light which is emitted from the light emitting diode element 4, reflected on the inclined surface 16 and enters in the lens or light which is emitted from the light emitting diode element 4 and enters directly in the lens. In addition, the light permeable member 10 in the second embodiment also includes a gas or air release hole 18 for communicating the groove 14 with the exterior.

The surface-mount type light emitting diode in the second embodiment has obviously the same advantageous effects as in the first embodiment, the directivity of light emitted from the light emitting diode element can be sharpened.

In addition, the present invention is not limited to the above-mentioned embodiments, the elements can be modified and embodied without departing a scope of the present invention in steps for embodying the invention. Moreover, various inventions are formed by an appropriate combination of a plurality of elements disclosed in the above-mentioned embodiments. For example, some elements may be deleted from all the elements disclosed in the embodiments. Further, elements in different embodiments may be suitably combined. For example, the light permeable member 10 may be formed by use of a light permeable glass.

Moreover, the filling member filled in the groove 14 in the total-reflection-surface-formed part 13 may be a light permeable member, for example, gas having a refraction index close to the refractive index of the air, nitrogen gas. In this case, an inclined angle of the inclined surface 16 may be formed in an angle for totally reflecting the emitted light from the light emitting diode element 4 obtained from a relationship of the above-mentioned formula (1) depending on a refractive index of each of various filling members filled in the groove 14.

Figure 15:
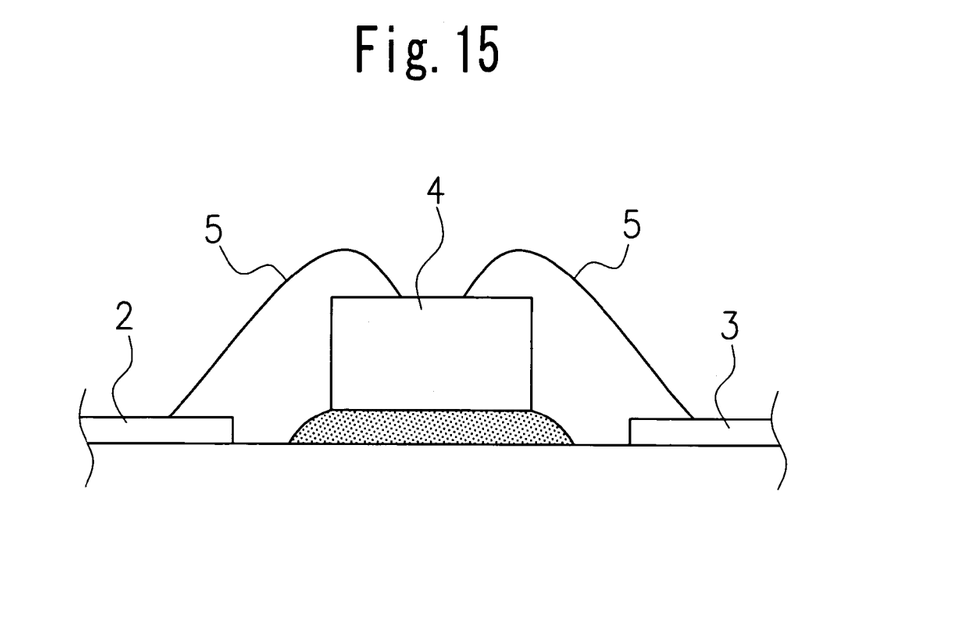
FIG. 15 is a view showing a connection of the light emitting diode element.

Furthermore, although the light emitting diode element 4 has been mounted directly on the substrate 1, the structure is not limited to this manner, the light emitting diode element 4 is disposed on the substrate 1, the light emitting diode element may be electrically connected with the cathode and anode electrode patterns by bonding wires, respectively, as shown in FIG. 15.

In addition, the light emitting diode element 4 may be electrically connected on the cathode electrode pattern 2, and with the anode electrode pattern 3 by the bonding wire 5, as shown in FIG. 16 in the prior art.

What is claimed is:

1. A surface-mount type light emitting diode, comprising:
   a substrate;
   cathode and anode electrode patterns provided on the substrate;
   a light emitting diode element provided on the substrate and electrically connected to the cathode and anode electrode patterns;
   a light permeable member having a groove therein and disposed on the substrate to seal the light emitting diode element;
   wherein the groove has a gas contained in the groove and surrounds the light emitting diode element, and
   wherein the light permeable member and the gas in the groove forms a boundary surface, which is configured to be a total reflection surface by a difference of refractive indexes of the gas and the light permeable member.

2. The surface-mount type light emitting diode according to claim 1,
   wherein the gas contained in the groove having a lower refractive index than the refractive index of the light permeable member having the groove.

3. The surface-mount type light emitting diode according to claim 2,
   wherein the total-reflection surface is formed at an inclined angle obtained from a relationship between the refractive index of the gas, a refractive index of the light permeable member, and an incident angle when the light emitted from the light emitting diode element enters the boundary surface between the light permeable member and the gas.

4. The surface-mount type light emitting diode according to claim 2,
   wherein the groove has an annular inclined surface.

5. The surface-mount type light emitting diode according to claim 1,
   wherein the total-reflection surface is formed at an inclined angle obtained from a relationship between the refractive index of the gas, the refractive index of the light permeable member, and an incident angle when the light emitted from the light emitting diode element enters the boundary surface.

6. The surface-mount type light emitting diode according to claim 1,
   wherein the groove has an annular inclined surface.

7. The surface-mount type light emitting diode according to claim 6,
   wherein the inclined surface is formed to extend in a height direction from the substrate.

8. The surface-mount type light emitting diode according to claim 1,
wherein the light permeable member comprises a light permeable resin or light permeable glass.

9. The surface-mount type light emitting diode according to claim 1,
wherein the light permeable member includes a lens for collecting the emitted light from the light emitting diode element.

10. A surface-mount type light emitting diode, comprising:
a substrate;
cathode and anode electrode patterns provided on the substrate;
a light emitting diode element provided on the substrate and electrically connected to the cathode and anode electrode patterns;
a light permeable member disposed on the substrate to seal the light emitting diode element;
a groove formed to surround the light emitting diode element and having an inclined surface extending in a "height" direction from a surface of the substrate within the light permeable member;
a gas contained in the groove; and a boundary surface provided between the light permeable member and the gas in the inclined surface,
the boundary surface forming a total-reflection surface for reflecting the emitted light from at least the side surfaces of the light emitting diode element upwardly and totally by a difference between a refractive index of the gas and a refractive index of the light permeable member.

* * * * *